United States Patent
Zhao et al.

(10) Patent No.: US 10,803,285 B2
(45) Date of Patent: Oct. 13, 2020

(54) DISPLAY PANEL WITH PHOTOSENSITVE CIRCUIT AND MANUFACTURING METHOD THEREOF AND DISPLAY DEVICE

(71) Applicant: BOE TECHNOLOGY GROUP CO., LTD., Beijing (CN)

(72) Inventors: Meng Zhao, Beijing (CN); Lei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 6 days.

(21) Appl. No.: 16/150,705

(22) Filed: Oct. 3, 2018

(65) Prior Publication Data
US 2019/0213379 A1    Jul. 11, 2019

(30) Foreign Application Priority Data

Jan. 11, 2018  (CN) .......................... 2018 1 0027988

(51) Int. Cl.
| | |
|---|---|
| G06K 9/00 | (2006.01) |
| H01L 27/32 | (2006.01) |
| H01L 51/56 | (2006.01) |
| G06F 3/041 | (2006.01) |
| H01L 51/52 | (2006.01) |

(52) U.S. Cl.
CPC ........ G06K 9/0004 (2013.01); G06F 3/0412 (2013.01); H01L 27/326 (2013.01); H01L 27/3227 (2013.01); H01L 27/3234 (2013.01); H01L 27/3246 (2013.01); H01L 51/52 (2013.01); H01L 51/5284 (2013.01); H01L 51/56 (2013.01)

(58) Field of Classification Search
CPC .............. G06K 9/0004; H01L 27/3227; H01L 27/3234; H01L 27/3246; H01L 51/5284
USPC ................................. 257/40, 80, 84, E31.095
See application file for complete search history.

(56) References Cited

U.S. PATENT DOCUMENTS

| | | | | |
|---|---|---|---|---|
| 2012/0256089 A1* | 10/2012 | Kanda | .................. | G06K 9/0004 250/338.1 |
| 2016/0342037 A1* | 11/2016 | Wang | ................ | G02F 1/133512 |
| 2017/0220840 A1* | 8/2017 | Wickboldt | ........... | G06K 9/0053 |

(Continued)

FOREIGN PATENT DOCUMENTS

| | | |
|---|---|---|
| CN | 106055162 A | 10/2016 |
| CN | 106684202 A | 5/2017 |
| CN | 106773219 A | 5/2017 |

OTHER PUBLICATIONS

The First Chinese Office Action dated Apr. 23, 2019; Appln. No. 201810027986.9.

*Primary Examiner* — Robert T Huber

(57) ABSTRACT

A display device includes a base substrate, a pixel defining layer, a spacer layer and a photosensitive circuit. The pixel defining layer is on the substrate and includes a pixel region and a pixel gap region; the spacer layer is on the pixel gap region of the pixel defining layer and at a side of the pixel defining layer away from the base substrate; and the photosensitive circuit is at a side of the pixel defining layer away from the spacer layer. The spacer layer is lightproof, a first opening is in the spacer layer, the first opening and the photosensitive circuit are overlapped with each other in a direction perpendicular to the base substrate, and the photosensitive circuit is configured to detect light passing through the first opening.

19 Claims, 4 Drawing Sheets

(56) References Cited

U.S. PATENT DOCUMENTS

2018/0060641 A1* 3/2018 Kim .................. G06K 9/00013
2018/0307088 A1 10/2018 Liu et al.
2019/0056613 A1 2/2019 Wang et al.

* cited by examiner

DISPLAY PANEL WITH PHOTOSENSITVE CIRCUIT AND MANUFACTURING METHOD THEREOF AND DISPLAY DEVICE

CROSS REFERENCE TO RELATED APPLICATION

The application claims priority to the Chinese patent application No. 201810027988.9, filed on Jan. 11, 2018, the entire disclosure of which is incorporated herein by reference as part of the present application.

TECHNICAL FIELD

Embodiments of the present disclosure relate to a display panel and a manufacturing method thereof, and a display device.

BACKGROUND

With the rapid development of mobile payment and mobile information communication, higher requirements are increasingly raised for a convenient and efficient security and protection technology which is applied in display devices. Due to the uniqueness of a fingerprint pattern, the fingerprint recognition technology combined with optical imaging is gradually adopted by mobile electrical devices. Meanwhile, the design for a narrow-bezel display screen has been becoming a mainstream and how to design a more improved optical imaging structure has attracted the attention of the industry.

SUMMARY

At least an embodiment of the present disclosure provides a display panel, and the display device comprises a base substrate, a pixel defining layer, a spacer layer and a photosensitive circuit. The pixel defining layer is on the substrate and comprises a pixel region and a pixel gap region; the spacer layer is on the pixel gap region of the pixel defining layer and at a side of the pixel defining layer away from the base substrate; and the photosensitive circuit is at a side of the pixel defining layer away from the spacer layer. The spacer layer is lightproof, a first opening is in the spacer layer, the first opening and the photosensitive circuit are overlapped with each other in a direction perpendicular to the base substrate, and the photosensitive circuit is configured to detect light passing through the first opening.

In the display panel provided by at least an embodiment of the present disclosure, a material of the spacer layer comprises a black matrix material.

In the display panel provided by at least an embodiment of the present disclosure, a material of the spacer layer comprises a black negative photoresist material.

In the display panel provided by at least an embodiment of the present disclosure, a plurality of first openings are in the spacer layer, the photosensitive circuit comprises a plurality of sensors which correspond to the first openings in one-to-one correspondence, and each of the first openings is overlapped with one of the sensors corresponding to the each of the first openings in the direction perpendicular to the base substrate.

In the display panel provided by at least an embodiment of the present disclosure, a side length or diameter of the first opening is in a range of 5 μm-15 μm.

In the display panel provided by at least an embodiment of the present disclosure, the photosensitive circuit is at a side of the base substrate away from the spacer layer, or the photosensitive circuit is at a same side of the base substrate as the spacer layer and is closer to the base substrate than the spacer layer.

In the display panel provided by at least an embodiment of the present disclosure, the pixel region comprises a light-emitting element.

The display panel provided by at least an embodiment of the present disclosure further comprises an encapsulating layer. The encapsulating layer covers the spacer layer and the light-emitting element, and an orthographic projection of the spacer layer and the light-emitting element on the base substrate falls within an orthographic projection of the encapsulating layer on the base substrate.

The display panel provided by at least an embodiment of the present disclosure further comprises a pixel driving circuit layer between the base substrate and the pixel defining layer, wherein the light-emitting element is electrically connected with the pixel driving circuit layer.

In the display panel provided by at least an embodiment of the present disclosure, a second opening is in the spacer layer to at least partially expose the pixel region of the pixel defining layer and also expose the light-emitting element.

In the display panel provided by at least an embodiment of the present disclosure, the spacer layer is a continuous layer structure in a region other than the first opening and the second opening.

In the display panel provided by at least an embodiment of the present disclosure, the base substrate is a flexible substrate and the display panel further comprises a buffer layer on the base substrate.

In the display panel provided by at least an embodiment of the present disclosure, a second opening is in the spacer layer to at least partially expose the pixel region of the pixel defining layer.

In the display panel provided by at least an embodiment of the present disclosure, the spacer layer is a continuous layer structure in a region other than the first opening and the second opening.

In the display panel provided by at least an embodiment of the present disclosure, the spacer layer and the pixel defining layer are formed in an integrated structure, and the first opening further runs through the pixel defining layer.

In the display panel provided by at least an embodiment of the present disclosure, a material of the integrated structure of the spacer layer and the pixel defining layer comprises a black matrix material.

At least an embodiment of the present disclosure further provides a display device, comprising any one display panel provided by embodiments of the present disclosure.

At least an embodiment of the present disclosure further provides a method of manufacturing a display panel, comprising: forming on a base substrate a pixel defining layer which comprises a pixel region and a pixel gap region; forming a spacer layer on the pixel gap region of the pixel defining layer; and providing a photosensitive circuit at a side of the pixel defining layer away from the spacer layer, wherein the spacer layer is lightproof, a first opening is formed in the spacer layer, and the first opening and the photosensitive circuit are overlapped with each other in a direction perpendicular to the base substrate, so as to allow the photosensitive circuit to detect light passing through the first opening.

In the method provided by at least an embodiment of the present disclosure, a black matrix material is adopted to form the spacer layer.

The method provided by at least an embodiment of the present disclosure further comprises forming a second opening in the spacer layer to at least partially expose the pixel region of the pixel defining layer, wherein the second opening and the first opening are formed in a same patterning process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Nowadays narrow-bezel display screen technologies are becoming the mainstream in the market. One solution to realize this kind of technology is to integrate a sensing circuit with fingerprint recognition function into the design of the backplate of the screen, so as to realize an under-screen fingerprint recognition function to increase the display region of the display screen. One technology to realize the under-screen technology is to use pinhole imaging principle to integrate a photosensitive circuit into a display panel to realize fingerprint recognition. In this kind of technology, a light-shielding layer is needed for providing pinholes for pinhole imaging.

Figure 1:
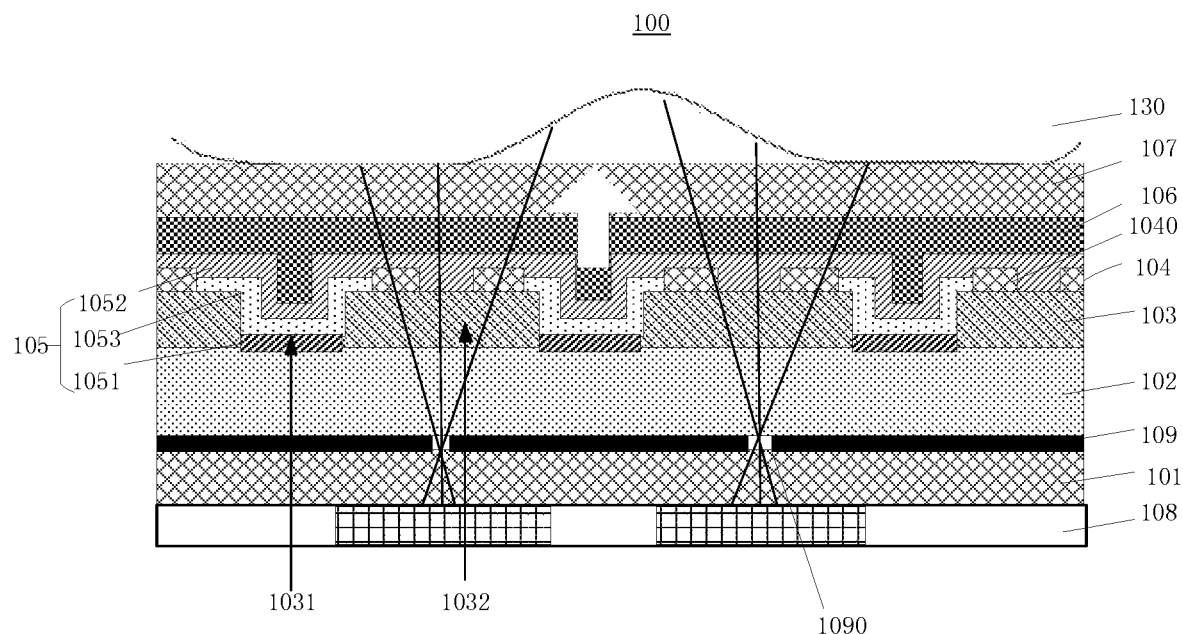
FIG. 1 is a sectional view of a display panel.

FIG. 1 is a sectional view of a display panel which uses pinhole imaging principle to realize fingerprint recognition. The display panel 100 is an organic light-emitting diode (OLED) display panel. As illustrated in FIG. 1, the display panel 100 comprises a first substrate 101 and a second substrate 107, and further comprises a pixel driving circuit layer 102, a pixel defining layer (PDL) 103, a spacer layer 104, an organic light-emitting element 105 and an encapsulation layer 106 which are disposed on the first substrate 101.

The organic light-emitting element 105 comprises a first electrode 1051, a second electrode 1052, and an organic light-emitting layer 1053 between the first electrode 1051 and the second electrode 1052. The first electrode 1051 is electrically connected with the pixel driving circuit layer 102. The pixel driving circuit layer 102 comprises a pixel driving circuit which is configured to drive the organic light-emitting element 105 to emit light, a gate line, a data line, a power source line and the like. Usually the pixel driving circuit of each sub-pixel comprises a driving transistor, a switch transistor, a capacitor and so on, which are electrically connected with the corresponding gate line, data line and power source line, respectively.

The pixel defining layer 103 is configured to separate adjacent sub-pixels and for example separate adjacent organic light-emitting layers 1053 of adjacent sub-pixels from each other so as to prevent cross color in display. An opening is formed in the pixel defining layer 103 to divide the pixel defining layer 103 for each sub-pixel into a pixel region 1031 and a pixel gap region 1032, and the pixel region 1031 is defined by the opening for example, as illustrated in the figure. The pixel region 1031 exposes the first electrode 1051 of the organic light-emitting element 105, and the organic light-emitting layer 1053 is formed in the pixel region 1031 of the pixel defining layer 103 and on the first electrode 1051 also. A photosensitive circuit 108 is at a side of the first substrate 101, and the side is away from the second substrate 107.

The spacer layer 104 can be configured to support an evaporation mask while forming the organic light-emitting layers 1053 through evaporation, so as to separate the pixel defining layer 103 from the evaporation mask to protect the pixel defining layer 103 from being scratched for example. The spacer layer 104 can be configured to further separate adjacent organic light-emitting layers from each other. The spacer layer 104 is usually formed of a resin material, such as polyimide (PI), and can also be an inorganic material such as silicon oxide. The spacer layer 104 usually comprises a plurality of spacers 1040 which are spaced apart from each other. A shape of the spacer 1040 is usually but not limited to cuboid, column, globule, semi-globule, or the like.

As illustrated in FIG. 1, a metal light-shielding layer 109 is usually disposed between the first substrate 101 and the pixel driving circuit layer 102 to form imaging holes 1090. For example, light emitted from the organic light-emitting element 105 is reflected by a surface of a touch subject (e.g., a finger) and the reflected light passes through the image hole 1090 to illustrate on the photosensitive circuit 108. For example, in a case where the touch subject is a finger, because a finger valley (the concave surface of the finger) and a finger ridge (the convex surface of the finger) of the finger have different light reflectivity, the photosensitive circuit 108 detects the light reflected by the finger and sends the detected data to a process circuit (not illustrated) for analysis so as to obtain an image of the finger surface, and the image is further used for fingerprint recognition.

However, the above mentioned metal light-shielding layer 109 can easily accumulate electric charges and because the metal light-shielding layer 109 is close to the pixel driving circuit layer 102, the accumulated electric charges significantly affect the performance of the pixel driving circuit (such as the switch performance of the transistor and the capacitance of the capacitor), adversely affecting display performance. Additionally, at least one additional mask process is needed to form the metal light-shielding layer so that the manufacturing cost is increased.

In the display panel and the manufacturing method thereof and the display device provided by at least an embodiment of the present disclosure, the spacer layer of the display panel is modified to further function as the light-shielding layer formed with the imaging holes. In this way, the performance of the pixel driving circuit is protected from the light-shielding layer and in at least one embodiment, no additional process is needed to form the light-shielding layer.

Non-restriction descriptions are given below to the display panel provided by the embodiments of the present disclosure in combination with several embodiments. As described below, in condition of no conflict, different features in these specific embodiments can be combined to obtain a new embodiment, which is also within the scope of the present disclosure.

Figure 2:
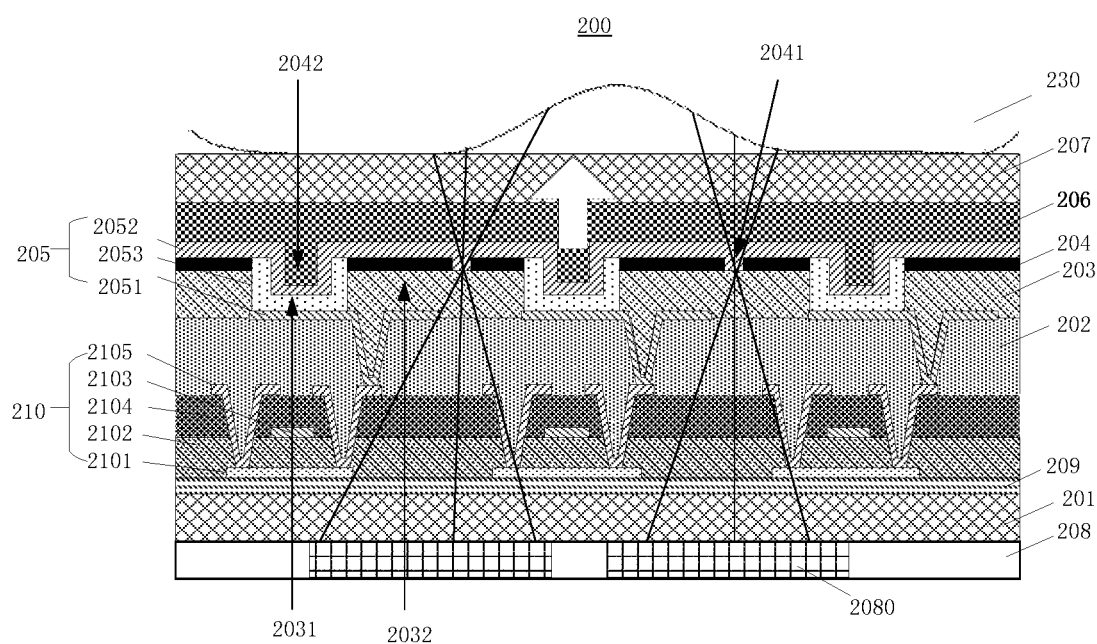
FIG. 2 is a sectional view of a display panel provided by an embodiment of the present disclosure.

An embodiment of the present disclosure provides a display panel 200. FIG. 2 illustrates a sectional view of the display panel 200. For example, the display panel 200 is an OLED display panel. As illustrated in FIG. 2, the display panel 200 comprises a first substrate (base substrate) 201 and a second substrate 207, and further comprises a pixel driving circuit layer 210, a planarization layer 202, a pixel defining layer 203, a spacer layer 204, a light-emitting element and an encapsulation layer 206 which are disposed on the first substrate 201. A photosensitive circuit 208 is at a side of the first substrate 201, and the side is away from the second substrate 207.

For example, the light-emitting element can be an organic light-emitting element 205, which comprises a first electrode 2051, a second electrode 2052 and an organic light-emitting layer 2053 between the first electrode 2051 and the second electrode 2052. The first electrode 2051 is electrically connected with the pixel driving circuit layer 210.

The pixel driving circuit layer 210 can comprise a conventional OLED pixel driving circuit for example, such as a 2T1C circuit, that is, each sub-pixel unit comprises two thin-film transistors and a storage capacitor Cs. One of the thin-film transistors is a switch transistor (not shown) and another thin-film transistor is a driving transistor. For clarification, FIG. 2 only illustrates the structure of the driving transistor. In the embodiments, the driving transistor is a top-gate structure; the driving transistor can also be a bottom-gate structure in other embodiments. As illustrated in the figure, the top-gate driving transistor comprises an active layer 2101, a gate insulating layer 2102, a gate electrode layer 2103, an interlayer dielectric layer (IDL) 2104 and a source-drain electrode layer 2105, and these layers are sequentially stacked in that order. The source electrode or the drain electrode is electrically connected with the first electrode 2051 of the organic light-emitting element 205.

The pixel defining layer 203 comprises a pixel region 2031 and a pixel gap region 2032. The pixel region 2031 exposes the first electrode 2051 of the organic light-emitting element 205, and the organic light-emitting layer 2053 is formed in the pixel region 2031 of the pixel defining layer 203 correspondingly and formed on the first electrode 2051.

The spacer layer 204 is on the pixel gap region 2032 of the pixel defining layer 203. The spacer layer 204 is lightproof. A first opening 2041 is formed in the spacer layer 204, and the first opening 2041 corresponds to the pixel gap region 2032 and also to the photosensitive circuit 208, that is, the first opening 2041 is overlapped with the pixel gap region 2032 as well as the photosensitive circuit 208 in the direction perpendicular to the first substrate 201. The first opening functions as an imaging hole for pinhole imaging, and the formed image is projected on the photosensitive circuit 208. During the working process, the finger of the user approaches or contacts the second substrate 207, and the organic light-emitting element 205 emits light, and the light is illustrated on the finger and reflected to the back side (the downside in the figure), and further passes through the first opening 2041 to illustrate on the photosensitive circuit 208 in a pinhole imaging manner. The photosensitive circuit 208 is configured to detect the incident light passing through the first opening 2041.

For example, the material of the spacer layer 204 is a black matrix material, i.e., the material for forming black matrix in a display panel. The black matrix is usually formed between sub-pixels to prevent cross color between light generated by different sub-pixels. For example, the material of the spacer layer 204 is a black negative photoresist material, for example, photoresist material mixing with carbon particles, so corresponding patterns can be obtained through exposure and development processes.

For example, a first opening 2041 or a plurality of first openings 2041 can be formed in the spacer layer 204 corresponding to the photosensitive circuit 208. For example, as for the first openings 2041, the photosensitive circuit 208 comprises a plurality of sensors corresponding to the first openings 2041 in one-to-one correspondence. For example, each first opening 2041 is overlapped with the sensor 2080 corresponding to this first opening 2041 in the direction perpendicular to the first substrate 201, that is, orthographic projections of the first openings 2041 and the sensors 2080 on the first substrate 201 are overlapped, so as to allow the sensors 2080 to collect light passing through the corresponding first openings 2041.

For example, each sensor collects light from the corresponding imaging hole and detects the fingerprint image of a corresponding region of the touch subject 203, and then the fingerprint images of the corresponding regions of the touch subject 203 are pieced together to form a complete fingerprint image.

Figure 3:
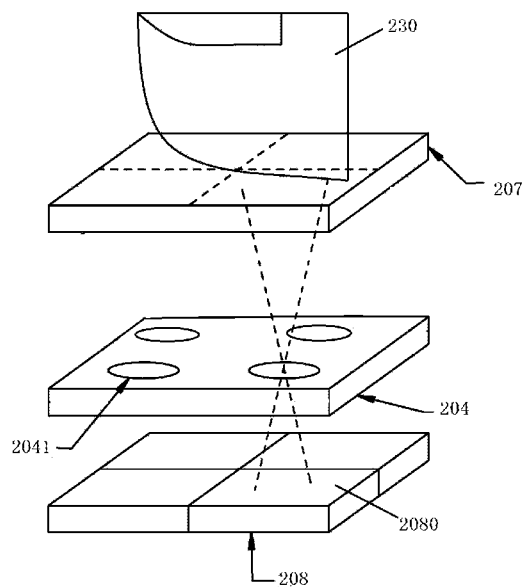
FIG. 3 is a schematic imaging process view of a display panel provided by an embodiment of the present disclosure.

FIG. 3 illustrates the meaning of "being pieced together to form a complete fingerprint image". Taking four first openings 2041 collecting the fingerprint image as an example, each sensor 2080 corresponding to one first opening 2041 only detects an effective portion of the surface of the touch subject 230, and the obtained four images are pieced together to form a complete fingerprint image.

For example, light passing through any two first openings 2041 is not overlapped in same one sensor 2080, so as to prevent light passing through different first openings 2041 from overlapping in the same one sensor and causing crosstalk.

The regions of the touch subject 203 detected by any two sensors 2080 are overlapped with each other so as to improve accuracy of the image which is formed by piecing together images of the regions.

For example, the gap between adjacent first openings 2041 is in the range of 200 μm-1 mm. The greater the gap is, the lower the density of the first openings 2041 is. If the density is too low, it may cause the number of the first opening 2041 to be too small, and it is different to form the image of the complete surface of the touch subject 230. If the density is too high, it may cause light passing through adjacent first openings 2041 to overlap at one sensor 2080 and crosstalk is caused.

For example, the side length or the diameter of the first opening 2041 is in the range of 5 μm-15 μm. The size is large enough to prevent diffraction from occurring to the light passing the first opening 2041.

For example, each sensor 2080 can comprise a photodiode and a switch transistor, the photodiode can convert light incident on the photodiode to an electrical signal. The switch transistor is electrically connected with the photodiode so as to control the photodiode to be in the state for collecting a light signal or not and to control the time of the collection of the light signal. For example, the photodiode can be a PIN junction photosensitive diode or a photosensitive transistor or the like, so as to improve the response speed of the photodiode.

For example, the photosensitive circuit 208 can detect visible light or infrared light, and can be electrically connected with a processing circuit for example, so that the image signal detected and collected by the photosensitive circuit 208 can be transported to the processing circuit to be further processed so as to obtain the fingerprint image. The fingerprint image can be applied accordingly, for example, in the application such as system unlocking, mobile payment or the like. The processing circuit can be a digital signal processor (DSP), a central processor and the like, and can further comprise a storing device according to need. The specific implementation models of the photosensitive circuit and the processing circuit are not limited in the embodiments of the present disclosure.

In the embodiments of the present disclosure, the photosensitive circuit 208 is disposed at a side of the first substrate 201 away from the spacer layer 204. For example, the photosensitive circuit as an independent device can be adhered to the side of the first substrate 201 away from the spacer layer 204 by attachment, for example, an adhesive tape, glue, or the like. In another embodiment, the photosensitive circuit 208 can be embedded into the first substrate 201. For example, a groove can be set in the first substrate 201, and the photosensitive circuit 208 is disposed within the groove. In still another embodiment, the photosensitive circuit 208 can be disposed between the spacer layer 204 and the first substrate 201, for example, integrated in the pixel driving circuit layer 210.

Those skilled in the art should understand that each lightproof layer between the spacer layer 204 and the photosensitive circuit 208 is provided an opening corresponding to the position of the first opening 2041. For example, the opening is filled by surrounding transparent material so as to ensure that light passing the first opening 2041 can reach the photosensitive circuit 208.

A second opening 2042 is disposed in the spacer layer 204 for each sub-pixel for example. The second opening corresponds to the pixel region 2031 so as to at least partially expose the pixel region and the first electrode 2051, so that the organic light-emitting layer 2053 can be formed corresponding to the pixel region 2031 of the pixel defining layer 203 and formed on the first electrode 2051. The first opening 2041 and the second opening 2042 can be formed in a same patterning process.

For example, the spacer layer 204 is a continuous layer structure in a region other than the first opening 2041 and the second opening 2042 (i.e., out of the first opening and the second opening), that is, the spacer layer 204 only disconnects or become discontinuous in the first opening 2041 and the second opening 2042. In this way, light reflected at a too large angle can be shielded and only light reflected at a relatively small angle can pass through the first opening 2041, so that the fingerprint information received by the photosensitive circuit 208 for detecting the fingerprint is more accurate. Additionally, a continuous and large-area spacer layer can be favorable to improve the support and separation function, compared with separated spacers.

In another embodiment, the pixel defining layer 203 and the spacer layer 204 can be formed in an integrated structure of a same material. In this situation, the material of the pixel defining layer is the same lightproof material as that of the spacer layer and the first opening 2041 further runs through the pixel defining layer 203. For example, the material of the integrated structure of the pixel defining layer 203 and the spacer layer 204 is a black matrix material, for example, resin.

For example, the first substrate 201 can be a bendable and flexible substrate, for example, various kinds of plastic film, or a substrate made of polyethylene glycol terephthalate (PET), polyether sulfone (PES), Polycarbonate (PC), or polyimide (PI) and the derivative of the above, or the like. Or, the first substrate 201 can be a rigid substrate, such as a glass substrate, a stainless steel substrate or the like.

For example, a buffer layer 209 can be disposed between the first substrate 201 and the pixel driving circuit layer 210. The buffer layer 209 can allow the first substrate 201 to have a more even surface. The buffer layer 209 can separate the first substrate and prevent harmful dopant ions in the surface or the internal of the first substrate 201 from diffusing into the pixel driving circuit layer and affecting the performance of the pixel driving circuit layer.

For example, the encapsulation layer 206 covers the spacer layer 204 and the organic light-emitting element 205, that is, the orthographic projection of the spacer layer 204 and the organic light-emitting element 205 on the first substrate 201 falls within the scope of the orthographic projection of the encapsulation layer 206 on the first substrate. For example, the encapsulation layer 206 is an organic film encapsulation layer. The encapsulation layer 206 is configured to encapsulate the organic light-emitting element 205 so as to protect the device from damage which is caused by external moisture and oxygen penetrating into the organic light-emitting element and the pixel circuit. For example, the encapsulation layer 206 and the second substrate 207 can be in an integrated structure.

For example, the display panel 200 further comprises a polarization layer (not shown) between the second substrate 207 and the encapsulation layer 206, so as to reduce the interference to the display caused by ambient light and to increase a display contrast ratio of the display panel. For example, the polarization layer is a circularly polarized light plate.

For example, the display panel 200 further comprises an adhesive layer (not shown) between the second substrate 207 and the encapsulation layer 206, so as to fix the second substrate 207 to the structure encapsulating the organic light-emitting element. The adhesive layer is a transparent optical adhesive (OCA).

For example, the organic light-emitting element 205 is an organic light-emitting diode. In the embodiment, the organic light-emitting element is a top-gate structure. In this situation, the first electrode 205 is a reflective electrode, so as to reflect light emitted from the organic light-emitting element 205 to the second substrate 207 at the display side, so that the emitting efficiency of the organic light-emitting element 205 is increased and the adverse influence to the pixel driving circuit structure layer 210 caused by the light is reduced. For example, the first electrode 2051 is an anode of the organic light-emitting element, and can be a stacked structure formed by indium tin oxide and a metal layer for example. The second electrode 2052 has a high transmittance. For example, the second electrode 2052 is a cathode of the organic light-emitting element, and can be made of a metal with a low work function such as Ag, Al, Ca, In, Li and Mg, or an alloy with a low function such as Mg/Ag.

Figure 4:
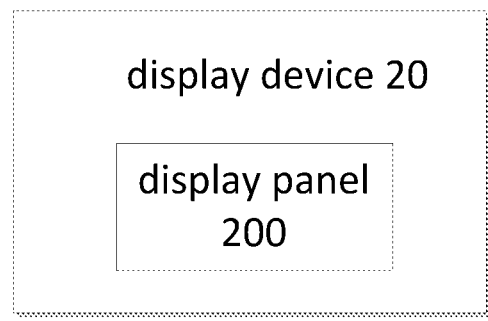
FIG. 4 is an exemplary block diagram of a display device provided by an embodiment of the present disclosure.

An embodiment of the present disclosure further provides a display device. For example, as illustrated in FIG. 4, the display device 20 comprises a display panel 200, and the display panel 200 can be any one of the display panels provided by the above-mentioned embodiment. It should be noted that other necessary components (e.g., a control device, an image data coding/decoding device, a clock circuit) for the display device 20 can adopt the known components/devices, which is not repeated here and not limited by the present disclosure.

For example, the display device 20 can be any product or component having display functions, such as a cellphone, a tablet, a television, a display device, a laptop, a digital photo frame, a navigator. The display device has an imaging function.

An embodiment of the present disclosure further provides a manufacturing method for the display panel provided by an embodiment of the present disclosure. The manufacturing method at least comprises: forming pixel defining layer which comprises a pixel region and a pixel gap region, forming a spacer layer on the pixel gap region of the pixel defining layer; and providing a photosensitive circuit at a side of the pixel defining layer away from the spacer layer. The spacer layer is lightproof, a first opening is formed in the spacer layer, and the first opening and the photosensitive circuit are overlapped with each other in the direction perpendicular to the base substrate, so as to allow the photosensitive circuit to detect light passing through the first opening.

The manufacturing method of the display panel provided by at least an embodiment of the present disclosure is described below in combination with FIG. 5A-FIG. 5F for example.

Step S51: providing a first substrate 201, and cleaning and drying the first substrate 201.

The first substrate 201 can be a bendable and flexible substrate, for example, various kinds of plastic film, or a substrate made of polyethylene glycol terephthalate (PET), polyether sulfone (PES), Polycarbonate (PC), or polyimide (PI) and the derivative of the above, or the like. Or, the first substrate 201 can be a rigid substrate, such as a glass substrate, a stainless steel substrate or the like. For example, a buffer layer 209 can be disposed between the first substrate 201 and the pixel driving circuit layer 210. The buffer layer 209 can be formed on the first substrate 201 to allow the first substrate 201 to have a more even surface. The buffer layer 209 can further prevent harmful dopant ions.

Figure 5A:
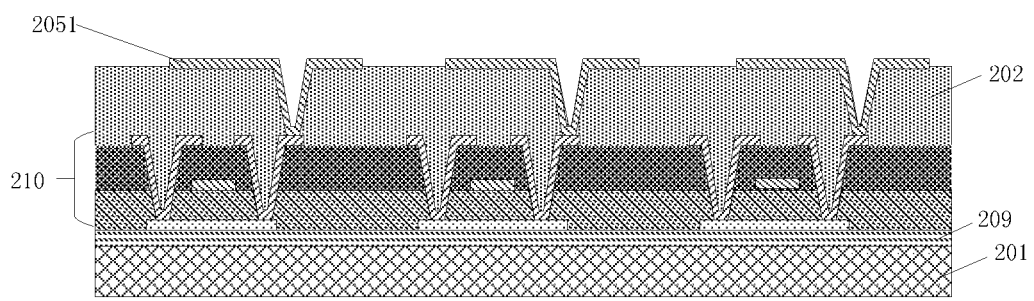
FIG. 5A to FIG. 5F are sectional views in steps of an exemplary manufacturing method of a display device provided by an embodiment of the present disclosure.

Step S52: as illustrated in FIG. 5A, sequentially forming a pixel driving circuit layer 210, a planarization layer 202, and a first electrode 2051 on the first substrate 201.

The pixel driving circuit layer 210 can comprise a conventional OLED pixel driving circuit for example, such as a 2T1C circuit. The manufacturing method of the pixel driving circuit layer 210 can comprise a manufacturing method of the conventional pixel driving method, conventional process steps such as sputtering (for forming a metal layer and a metal oxide layer for example), chemical vapor deposition (for forming an inorganic medium layer for example), ink-jet printing or spin coating (for an organic medium layer for example), photolithography (for patterning for example).

For example, the first electrode 2051 is an anode of the organic light-emitting diode and can be formed by the stack layer of an indium tin oxide layer and a metal layer.

Figure 5B:
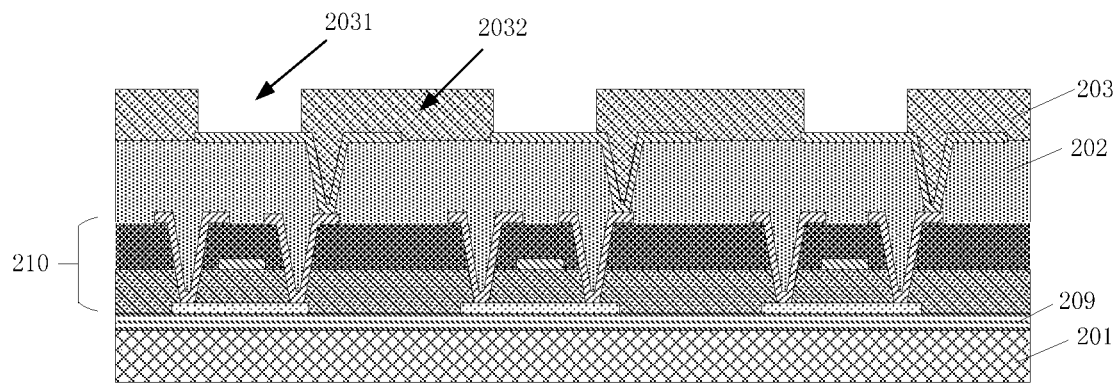

Step S53: as illustrated in FIG. 5B, forming a pixel defining layer 203 on the first electrode 2051, comprising a pixel region 2031 and a pixel gap region 2032

In an embodiment, an organic material layer is formed first and a pixel region 2031 and a pixel gap region 2032 are defined in the organic material layer, and an opening is formed through a patterning process in the pixel gap region 2031; the opening exposes at least a part of the first electrode 2051.

In another embodiment, an organic solution is provided to a predetermined location by using an ink-jet printing method to form the pixel gap region 2032, and the organic solution covers a portion of the first electrode 2051 for example. The location uncovered by the organic solution is used to form the pixel region 2031. The organic solution is cured through heating the pattern formed by the organic solution to obtain the pixel defining layer. For example, the organic solution is a resin solution.

Figure 5C:
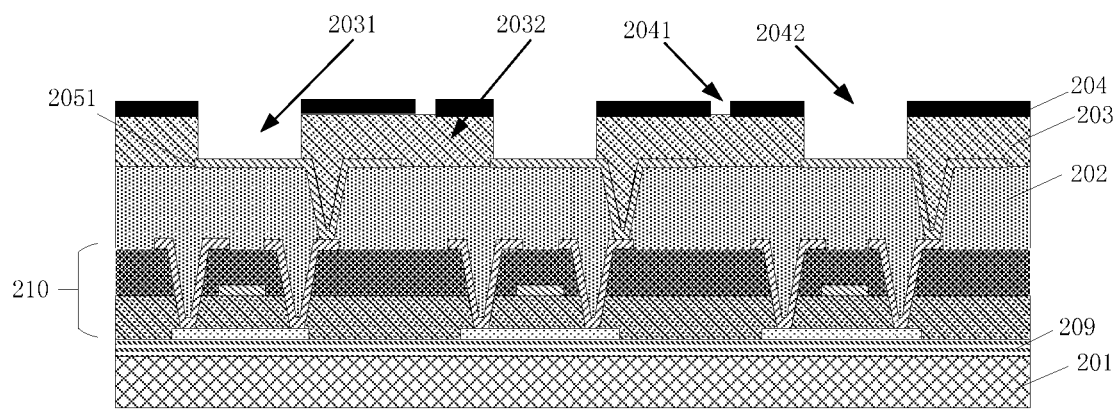

Step S54: as illustrated in FIG. 5C, forming a spacer layer 204 on the pixel defining layer 203, that is, forming the spacer layer 204 in the pixel gap region 2032 of the pixel defining layer 203. A first opening 2041 is formed in a predetermined position for forming the image hole in the spacer layer, and a second opening 2042 is formed corresponding to the pixel region to at least partially expose the pixel region and the first electrode 2051. The spacer layer is lightproof.

For example, the side length or the diameter of the first opening is in a range of 5 μm-15 μm.

For example, an organic solution is formed on the pixel defining layer 203 by using a spin coating process and the organic solution is cured to form the spacer layer. The first opening 2041 and the second opening 2042 are formed by using exposure, development process, and so on. For example, the first opening 2041 and the second opening 2042 can be formed in a same patterning process.

For example, a black matrix material is adopted to form the spacer layer 204.

For example, the material adopted to form the spacer layer 204 is a black negative photoresist material. For example, the black negative photoresist material is obtained by doping carbon particles in a negative photoresist, which is not limited in the embodiments of the present disclosure.

For example, the spacer layer 204 is a continuous layer structure in a region other than the first opening and the second opening, that is, the spacer layer 204 only disconnects or become discontinuers in the first opening 2041 and the second opening 2042. In this way, light reflected at a too large angle can be shielded and only light reflected at a relatively small angle can pass through the first opening 2041, so the fingerprint information received by the photosensitive circuit 208 through detecting the fingerprint is more accurate. Additionally, a continuous and large-area spacer layer can help to improve the support and separation function, compared with separated spacers.

Figure 5D:
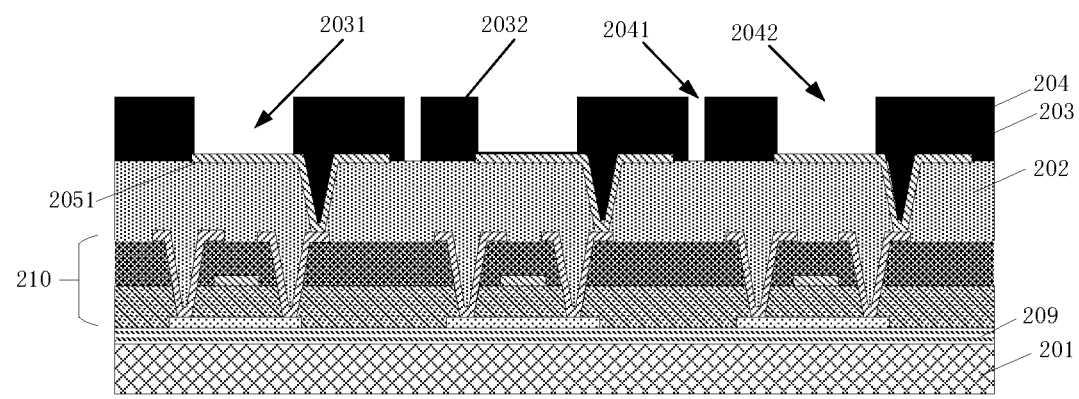

In a modified embodiment, the pixel defining layer and the spacer layer can be formed in an integrated structure by using a same material. In this situation, the material of the pixel defining layer is the same lightproof material as that of the spacer layer and the first opening 2041 should further run through the pixel defining layer 203 to realize pinhole imaging. Meanwhile, the second opening is connected with the opening in the pixel region. Thus, as illustrated in FIG. 5D, the first opening 2041 and the second opening 2042 in the pixel defining layer can be formed in a same patterning process.

Figure 5E:
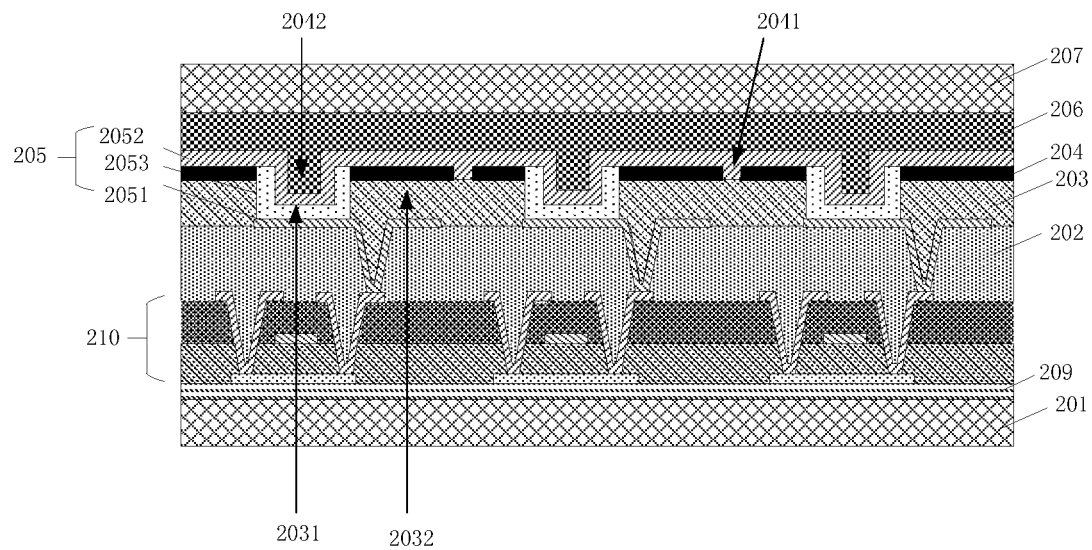

Step S55: as illustrated in FIG. 5E, sequentially forming an organic light-emitting layer 2053, a second electrode 2052 to form the organic light-emitting element 205, and forming an encapsulation layer 206 and fixing a second substrate 207.

For example, the organic light-emitting layer 2053 is formed in the pixel region 2031 of the pixel defining layer correspondingly and also formed on the first electrode 2051. For example, the encapsulation layer 206 covers the spacer layer and the organic light-emitting element.

Figure 5F:
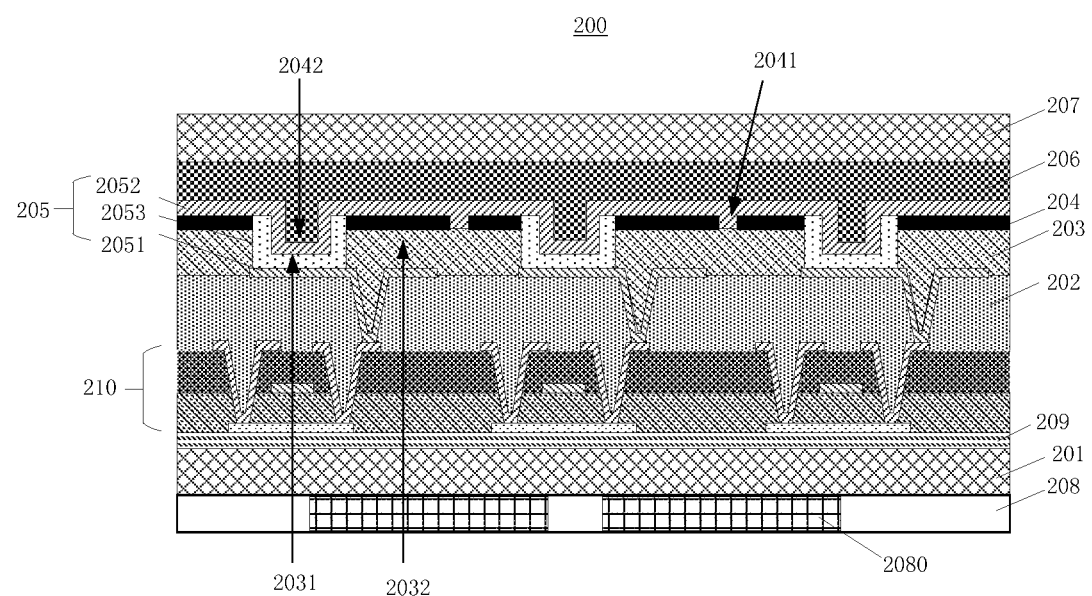

Step S56: as illustrated in FIG. 5F, adhering a photosensitive circuit 208 to a side of the first substrate away from the second substrate in which the photosensitive circuit 208 correspond to the first opening 2041, that is, the photosensitive circuit 208 and the first opening 2041 are overlapped with each other in a direction perpendicular to the first substrate 201. In this way, the display panel 200 as illustrated in FIG. 2 is formed.

In another embodiment, the photosensitive circuit 208 can be embedded into the first substrate 201. For example, a groove is formed in the first substrate 201, and the photosensitive circuit 208 is disposed within the groove. In still another embodiment, the photosensitive circuit 208 can be disposed between the spacer layer 204 and the first substrate 201, for example, integrated in the pixel driving circuit layer 210, which is not limited to the embodiments of the present disclosure.

For example, a plurality of first openings 2041 can be formed in the spacer layer 204 corresponding to the photosensitive circuit 208, and the photosensitive circuit 208 comprises a plurality of sensors corresponding to the first openings 2041 in one-to-one correspondence.

In the display panel and the manufacturing method thereof and the display device provided by at least an embodiment of the present disclosure, the spacer layer structure of the display panel is further used to form a light-shielding layer for forming the imaging holes so as to realize an under-screen fingerprint recognition function. In this way, the performance of the pixel driving circuit is protected from the light-shielding layer and no additional process is needed.

What are described above is related to the illustrative embodiments of the disclosure only and not limitative to the scope of the disclosure; the scopes of the disclosure are defined by the accompanying claims.

What is claimed is:

1. A display panel, comprising:
   a base substrate,
   a pixel defining layer, which is on the substrate and comprises a pixel region and a pixel gap region;
   a spacer layer, which is on the pixel gap region of the pixel defining layer and at a side of the pixel defining layer away from the base substrate;
   a light-emitting element, comprising a first electrode, a second electrode and an organic light-emitting layer between the first electrode and the second electrode, wherein the first electrode is at a side of the pixel defining layer close to the base substrate and is at least partially exposed by the pixel region; the light-emitting layer is on the first electrode and at a side of the pixel defining layer away from the base substrate; and
   a photosensitive circuit, at a side of the pixel defining layer away from the spacer layer,
   wherein the spacer layer is lightproof, a first opening is in the spacer layer, the first opening and the photosensitive circuit are overlapped with each other in a direction perpendicular to the base substrate, and the photosensitive circuit is configured to detect light emitted by the light-emitting element and passing through the first opening;
   the light-emitting layer of the light-emitting element is provided with an opening which exposes at least a portion of the pixel gap region of the pixel defining layer;
   the spacer layer and the pixel defining layer are formed in an integrated structure and made of a same material, and the first opening further runs through the pixel defining layer.

2. The display panel according to claim 1, wherein a material of the spacer layer comprises a black matrix material.

3. The display panel according to claim 1, wherein a material of the spacer layer comprises a black negative photoresist material.

4. The display panel according to claim 1, wherein a plurality of first openings are in the spacer layer,
   the photosensitive circuit comprises a plurality of sensors which correspond to the first openings in one-to-one correspondence, and each of the first openings is overlapped with one of the sensors corresponding to the each of first openings in the direction perpendicular to the base substrate.

5. The display panel according to claim 1, wherein a side length or a diameter of the first opening is in a range of 5 μm-15 μm.

6. The display panel according to claim 1, wherein the photosensitive circuit is at a side of the base substrate away from the spacer layer.

7. The display panel according to claim 1, wherein the first opening is in the spacer layer is not overlapped with the light-emitting layer in the direction perpendicular to the base substrate.

8. The display panel according to claim 1, further comprising an encapsulating layer, wherein the encapsulating layer covers the spacer layer and the light-emitting element, and an orthographic projection of the spacer layer and the light-emitting element on the base substrate falls within an orthographic projection of the encapsulating layer on the base substrate.

9. The display panel according to claim 1, further comprising a pixel driving circuit layer between the base substrate and the pixel defining layer, wherein the light-emitting element is electrically connected with the pixel driving circuit layer.

10. The display panel according to claim 6, wherein the base substrate is a flexible substrate and the display panel further comprises a buffer layer on the base substrate.

11. The display panel according to claim 1, wherein a second opening is in the spacer layer to at least partially expose the pixel region of the pixel defining layer and the light-emitting element.

12. The display panel according to claim 11, wherein the spacer layer is a continuous layer structure in a region other than the first opening and the second opening.

13. The display panel according to claim 1, wherein a material of the integrated structure of the spacer layer and the pixel defining layer comprises a black matrix material.

14. A display device comprising the display panel according to claim 1.

15. The display panel according to claim 1, wherein at least a portion of the light-emitting layer is in the pixel region and in contact with a side surface, which is exposed by the pixel region, of the pixel gap region.

16. The display panel according to claim 1, wherein the spacer layer is not overlapped with the light-emitting layer in the direction perpendicular to the base substrate.

17. A method of manufacturing a display panel, comprising:
   forming on a base substrate a pixel defining layer which comprises a pixel region and a pixel gap region;
   forming a spacer layer on the pixel gap region of the pixel defining layer;
   forming a light-emitting element, comprising forming a first electrode, a second electrode and an organic light-emitting layer between the first electrode and the second electrode, wherein the first electrode is at a side of the pixel defining layer close to the base substrate and is at least partially exposed by the pixel region; the light-emitting layer is on the first electrode and at a side of the pixel defining layer away from the base substrate; and
   providing a photosensitive circuit at a side of the pixel defining layer away from the spacer layer,
   wherein the spacer layer is lightproof, a first opening is formed in the spacer layer, and the first opening and the photosensitive circuit are overlapped with each other in a direction perpendicular to the base substrate, so as to allow the photosensitive circuit to detect light emitted by the light-emitting element and passing through the first opening;
   the method further comprises forming an opening in the light-emitting layer of the light-emitting element, and the opening exposes at least a portion of the pixel gap region of the pixel defining layer;
   the spacer layer and the pixel defining layer are formed in an integrated structure and made of a same material, and the first opening further runs through the pixel defining layer.

18. The method according to claim 17, wherein a black matrix material is adopted to form the spacer layer.

19. The method according to claim 17, further comprising forming a second opening in the spacer layer to at least partially expose the pixel region of the pixel defining layer, wherein the second opening and the first opening are formed in a same patterning process.

* * * * *